(12) United States Patent
Pandey et al.

(10) Patent No.: US 7,766,691 B2
(45) Date of Patent: Aug. 3, 2010

(54) LAND GRID ARRAY (LGA) SOCKET LOADING MECHANISM FOR MOBILE PLATFORMS

(75) Inventors: Vinayak Pandey, Chandler, AZ (US); Mingji Wang, Midland, MI (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/769,430

(22) Filed: Jun. 27, 2007

(65) Prior Publication Data

US 2009/0004902 A1    Jan. 1, 2009

(51) Int. Cl.
*H01R 13/00* (2006.01)

(52) U.S. Cl. .......................... 439/487; 439/73; 361/709; 361/711

(58) Field of Classification Search ................ 439/161, 439/73, 485, 487; 361/668, 702, 709–711
See application file for complete search history.

(56) References Cited

U.S. PATENT DOCUMENTS

| | | | |
|---|---|---|---|
| 6,137,298 A | 10/2000 | Binns | |
| 6,191,480 B1 * | 2/2001 | Kastberg et al. | 257/727 |
| 6,282,093 B1 | 8/2001 | Goodwin | |
| 6,366,460 B1 * | 4/2002 | Stone et al. | 361/679.47 |
| 6,483,708 B2 * | 11/2002 | Ali et al. | 361/719 |
| 6,545,879 B1 * | 4/2003 | Goodwin | 361/807 |
| 6,626,683 B2 | 9/2003 | Lai | |
| 6,735,085 B2 | 5/2004 | McHugh et al. | |
| 6,743,037 B2 | 6/2004 | Kassa et al. | |
| 6,746,270 B2 * | 6/2004 | Peterson et al. | 439/487 |
| 6,972,485 B2 * | 12/2005 | Kong et al. | 257/704 |
| 6,977,434 B2 * | 12/2005 | Martino | 257/727 |
| 7,118,385 B1 | 10/2006 | Bodenweber et al. | |
| 7,252,517 B2 * | 8/2007 | Ju | 439/73 |
| 7,280,362 B2 * | 10/2007 | Hood et al. | 361/719 |
| 7,327,577 B2 * | 2/2008 | Gilliland et al. | 361/719 |
| 7,468,888 B2 * | 12/2008 | Chang | 361/719 |
| 7,554,809 B2 * | 6/2009 | Chang | 361/711 |
| 2007/0236887 A1 * | 10/2007 | Cheng et al. | 361/700 |
| 2007/0297143 A1 * | 12/2007 | Martinson et al. | 361/719 |

FOREIGN PATENT DOCUMENTS

WO    2009/002728 A2    12/2008

OTHER PUBLICATIONS

LGA775 Socket, Mechanical Design Guide, Intel, Feb. 2006, Document No. 302666-003, 25 pages.
Thermal and Mechanical Design Guidelines, Intel Core TM 2 Du Desktop Processor, Intel Pentium Dual Core Processor, and Intel Pentium 4 Processor 6×1 Sequence, Jun. 2007, Document No. 313685-004, 114 pages.

* cited by examiner

*Primary Examiner*—Edwin A. Leon
*Assistant Examiner*—Vanessa Girardi
(74) *Attorney, Agent, or Firm*—Kacvinsky LLC

(57) ABSTRACT

Techniques for a land grid array (LGA) socket loading mechanism for mobile platforms are described. An apparatus includes a LGA socket mounted to a printed circuit board, and an LGA package seated in the LGA socket. The LGA package includes an LGA package substrate and a semiconductor die mounted on the LGA package substrate, and a heat pipe attached to the semiconductor die, wherein the heat pipe is to apply a compressive load to the semiconductor die. The heat pipe includes at least two leaf springs to apply a compressive load to the LGA package substrate. Other embodiments are described and claimed.

23 Claims, 20 Drawing Sheets

LAND GRID ARRAY (LGA) SOCKET LOADING MECHANISM FOR MOBILE PLATFORMS

BACKGROUND

Semiconductor devices, such as microprocessor dies, are typically mounted to a package substrate and attached to a printed circuit board (PCB), such as a motherboard, through a socket. The socket interfaces with connections on the package to distribute power to and signals from the package (and the semiconductor device) to other devices. Several technologies exist for making connections between the socket and the package, including pin grid array (PGA), ball grid array (BGA), and land grid array (LGA).

A typical LGA package for desktop platforms includes an integrated heat spreader (IHS) that covers the semiconductor die and substantially all of the package substrate. A compressive load may be applied to the IHS to ensure that the LGA package has a reliable electrical connection to the socket and the printed circuit board.

Mobile platforms such as notebook or laptop computers or other portable electronic devices may be unable to utilize a desktop LGA package that includes an integrated heat spreader due to height constraints in the system.

BRIEF DESCRIPTION OF THE DRAWINGS

A better understanding of embodiments of the present invention can be obtained from the following detailed description in conjunction with the following drawings, in which.

Figure 1A:
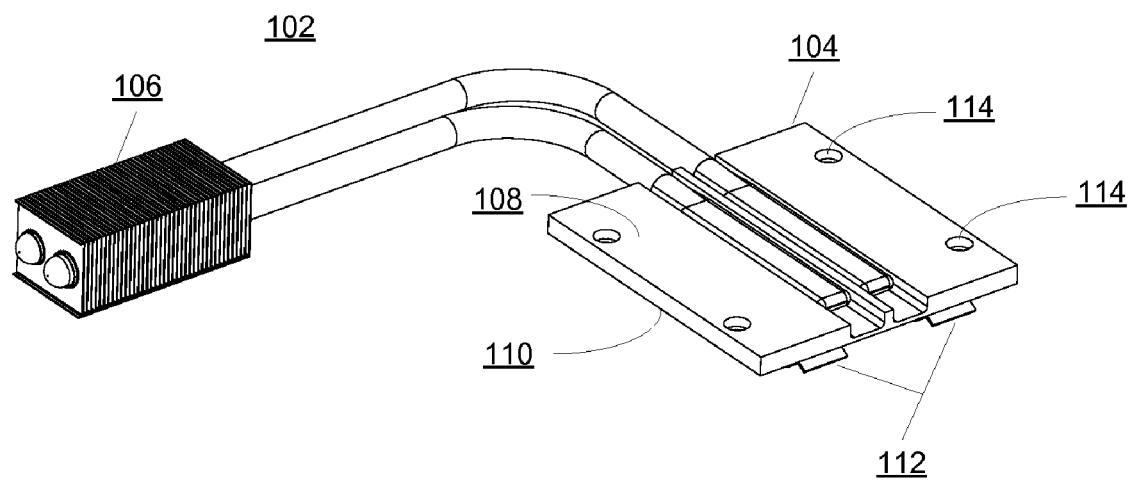
FIGS. 1A-1D are illustrations of a heat pipe having compressible leaf springs according to some embodiments.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment," "an embodiment," "example embodiment," "various embodiments," etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

FIGS. 1A-1D are illustrations of a heat pipe 102 having compressible leaf springs according to some embodiments. FIG. 1A illustrates a three-dimensional top/side view of a heat pipe 102. The heat pipe 102 may have a conductive plate 104 at one end, to transfer heat from a processor or other heat generating component to a heat sink 106 at the other end of the heat pipe 102. In some embodiments, the conductive plate 104 may be a metal plate having a thickness of approximately 0.5 to 2 mm. The conductive plate 104 has a top surface 108 and a bottom surface 110. The top surface 108 of the conductive plate may be connected to the heat pipe 102. The bottom surface 110 of the conductive plate may include two or more leaf springs 112 to make contact with and to apply a compressive load to a semiconductor package substrate. The conductive plate may also include a plurality of through-holes 114. The through-holes 114 may be used to attach the heat pipe 102 to a component on a printed circuit board, such as an electronic component seated in a land grid array (LGA) socket.

Figure 1B:
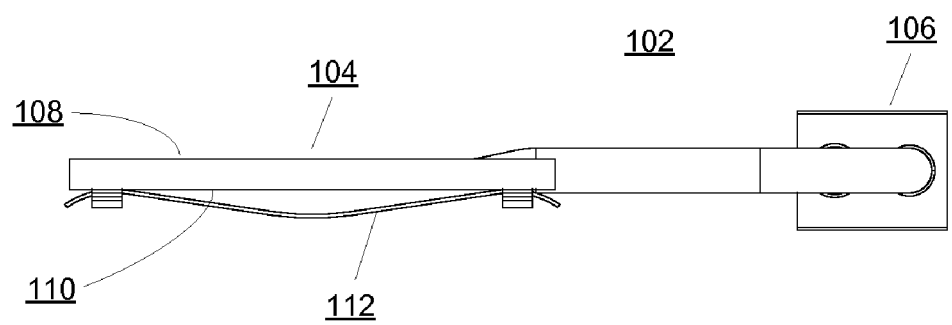

FIG. 1B illustrates a side view of the heat pipe 102 of FIG. 1A. As described above, leaf springs 112 are mounted to the bottom surface 110 of the heat pipe's conductive plate 104. The leaf springs 112 may be used to apply a compressive load directly on a package substrate seated in an LGA socket. In some embodiments, the leaf springs 112 may be metal. The leaf springs may in some embodiments have a thickness of approximately 0.5 mm, and may be capable of generating a load having a magnitude of approximately 60 lbf (pound-force) on a package substrate. Leaf springs having a thickness of greater than 0.5 mm may be capable of generating a load greater than 60 lbf. When the leaf springs are compressed, they may be completely flat or nearly completely flat, thus meeting the stringent height requirements for mobile platforms. In some embodiments, another type of spring may be mounted to the bottom surface of the conductive plate 104 to apply a compressive load directly to a package substrate.

Figure 1C:
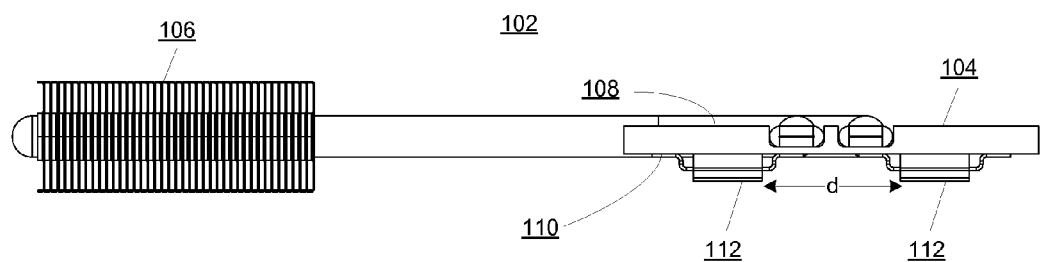

FIG. 1C illustrates a front view of the heat pipe 102 of FIG. 1A. The leaf springs 112 may be separated from one another by a distance, d. In some embodiments, the distance d may be a distance that is greater than the width of a semiconductor die mounted on an LGA package. Thus, the leaf springs may straddle the semiconductor die and make contact only with a top surface of the LGA package, thus applying a compressive load directly to the top surface of the package substrate. The bottom surface 110 of the conductive plate 104 may make contact with the top surface of a semiconductor die, thus applying a compressive load directly to the top surface of the semiconductor die.

Figure 1D:
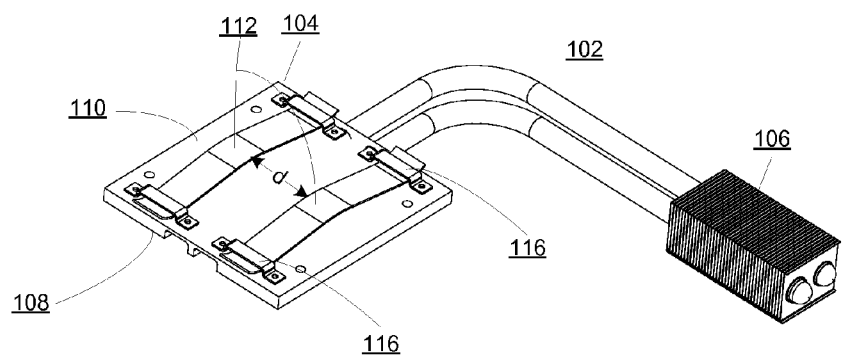

FIG. 1D illustrates a three-dimensional bottom/side view of a heat pipe 102. As illustrated and described above in FIGS. 1A-1C, leaf springs 112 are mounted to the bottom 110 of conductive plate 104. The leaf springs 112 are separated by a distance, d, which is greater than a width of a die mounted to an LGA package. The leaf springs 112 may be held in place by leaf spring retention mechanisms 116. One leaf spring retention mechanism 116 may hold each end of a leaf spring 112 in place. The retention mechanism 116 may permit some movement of the leaf spring 112, such that the leaf spring is allowed to flatten when compressed, thus applying a compressive load to an LGA package substrate.

Figure 2:
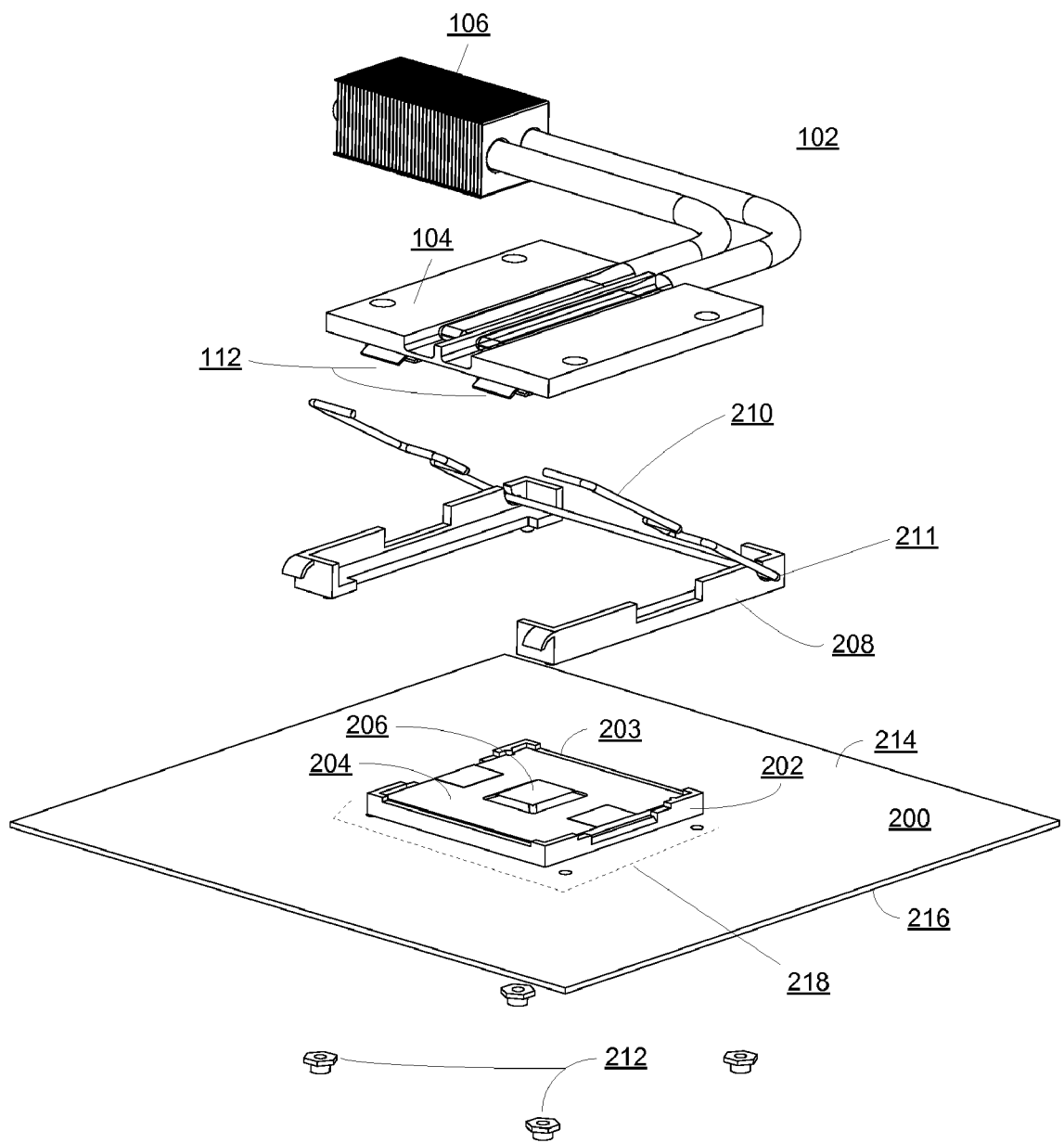
FIG. 2 is an illustration of an exploded view of a heat pipe assembly using a lever actuated loading mechanism according to some embodiments.

FIG. 2 is a three-dimensional exploded view illustrating assembly of the heat pipe 102 of FIGS. 1A-1D to a printed circuit board using a lever actuated loading mechanism. A printed circuit board 200 has a land grid array (LGA) socket 202 mounted on a top surface 214 of the printed circuit board. A printed circuit board may have components mounted on both a top surface and a bottom surface, however as described herein the top surface of the printed circuit board is the surface on which an LGA socket is mounted. AN LGA package 203 is seated in the LGA socket 202. The LGA package includes an LGA package substrate 204 and a semiconductor die 206 mounted on a top surface of the LGE package substrate 204. In some embodiments the semiconductor die may be a microprocessor, chipset, memory device, or other type of electronic component. In some embodiments, multiple semiconductor die 206 may be mounted to a top surface of the LGA package substrate 204. In some embodiments, a layer of a thermal interface material (TIM) may be placed on the top surface of the semiconductor die 206, between the semiconductor die and the conductive plate 104 of the heat pipe 102.

A lever actuated loading mechanism 208 may be mounted over the LGA socket 202. In some embodiments, when assembled, the LGA socket 202 may be seated inside the lever actuated loading mechanism 208. The lever actuated loading mechanism 208 may include an actuating lever 210 which may pivot around an axis 211 to hold the heat pipe 102 in place and to apply separate compressive loads to die 206 and package substrate 204.

In some embodiments, an optional back plate 218 may be mounted on a bottom surface 216 of a printed circuit board 200 directly below the LGA socket 202. The back plate 218, LGA socket 202, and lever actuated loading mechanism 208 may be aligned with one another. The back plate 218 may provide stiffness to the printed circuit board 200 in the region under and/or around the LGA socket 202.

The back plate 218, printed circuit board 200, and lever actuated loading mechanism 208 may be secured to one another using fastening mechanisms 212. Fastening mechanism 212 may be screws, nuts and bolts, snaps, clips, or any other through-hole fastening mechanism suitable for use in a printed circuit board assembly process.

The conductive plate 104 of heat pipe 102 may be seated in the lever actuated loading mechanism 208 after the lever actuated loading mechanism 208 has been attached to the printed circuit board 200.

Figure 3:
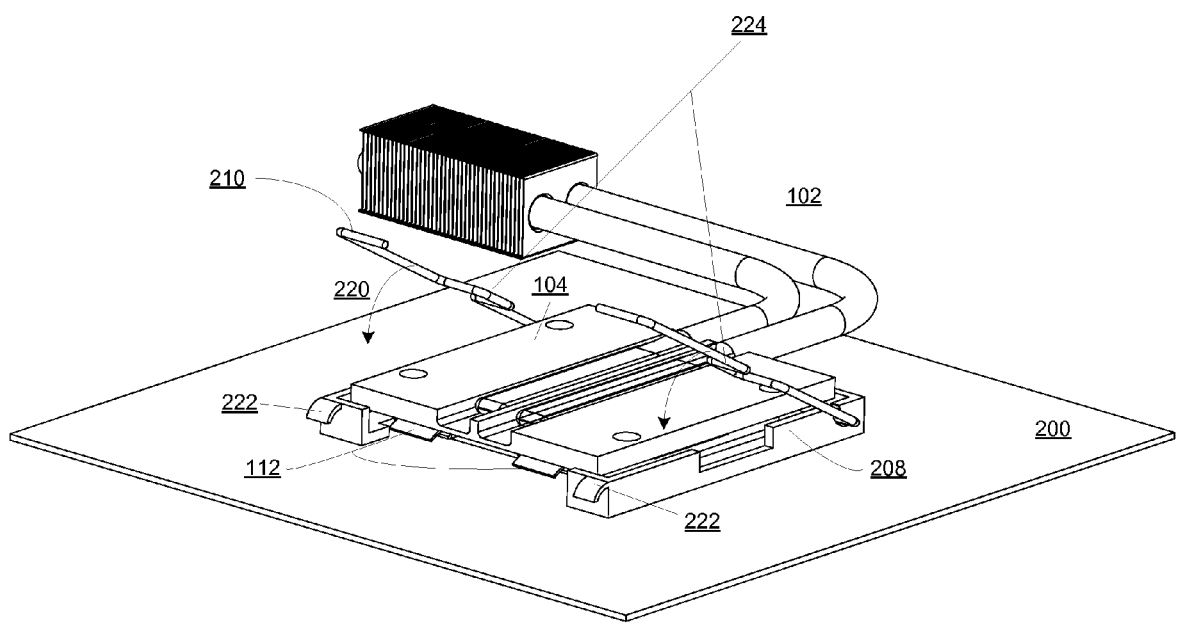
FIG. 3 is an illustration of a lever actuated loading mechanism according to some embodiments.

FIG. 3 illustrates the assembly of FIG. 2 according to some embodiments. After the lever actuated loading mechanism 208 has been attached to the printed circuit board 200, the conductive plate 104 of heat pipe 102 may be seated in the lever actuated loading mechanism 208. The levers 210 of the retention mechanism 208 may then be actuated 220. In some embodiments, the levers 210 may snap into place under clips 222. When the levers 210 are secured in place over the conductive plate 104, a loading portion of the levers 224 may make contact with and apply a load to the conductive plate 104. The leaf springs 112 of the conductive plate will contact the top surface of the LGA package substrate (FIG. 2, 204), and may be fully or nearly fully compressed to apply a compressive load of approximately 60-80 lbf directly to the LGA package substrate. The bottom surface of the conductive plate 104 will contact the top surface of the die (FIG. 2, 206), and may apply a compressive load of approximately 30-40 lbf directly to the die. Thus, when the levers 210 are fully actuated and secured, a total load of approximately 90-120 lbf may be applied to the die and the package substrate by the conductive plate 104 and the leaf springs 112, respectively.

Figure 4:
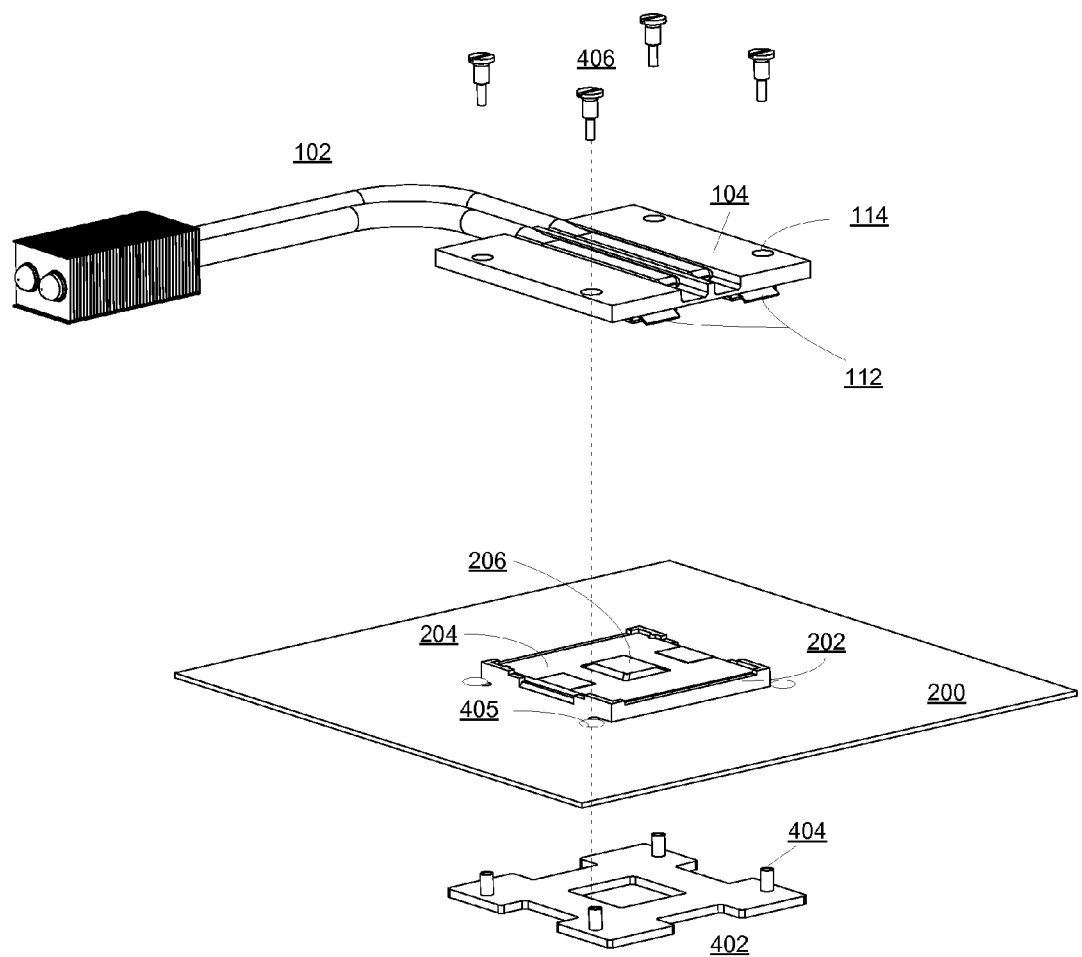
FIG. 4 is an illustration of an exploded view of a heat pipe assembly using screw displacement according to some embodiments.

FIG. 4 is a three-dimensional exploded view illustrating assembly of the heat pipe 102 of FIGS. 1A-1D to a printed circuit board using a screw displacement loading mechanism. As described above with respect to FIG. 2, printed circuit board 200 has an LGA socket 202 mounted on a top surface of the printed circuit board. An LGA package is seated in the LGA socket 202, the LGA package including a package substrate 204 and a semiconductor die 206 mounted on the package substrate 204.

A back plate 402 may be mounted on the bottom side of the printed circuit board 200, directly beneath the LGA socket. The back plate may include fastener receptacles 404, which in some embodiments may extend partially or fully through holes 405 in the printed circuit board 200.

The conductive plate 104 of the heat pipe 102 may be attached to the printed circuit board 200 and back plate 402 with fasteners 406. The fasteners 406 may extend through through-holes 114 in the conductive plate 104 and may be received by fastener receptacles 404 of the back plate 402. In some embodiments, the fasteners 406 may be screws.

When the fasteners are 406 are placed into fastener receptacles 404 of the back plate 402 and are tightened, a bottom surface of the conductive plate 104 may make contact with and apply a compressive load to the die 206 and the leaf springs 112 may make contact with and apply a compressive load to the package substrate 204. The leaf springs 112 may be fully or nearly fully compressed to apply a compressive load of approximately 60-80 lbf directly to the LGA package substrate 204. The bottom surface of the conductive plate 104 may apply a compressive load of approximately 30-40 lbf directly to the die. Thus, when the fasteners or screws 406 are tightened to a predetermined level, a total load of approximately 90-120 lbf may be applied to the die and the package substrate.

Figure 5:
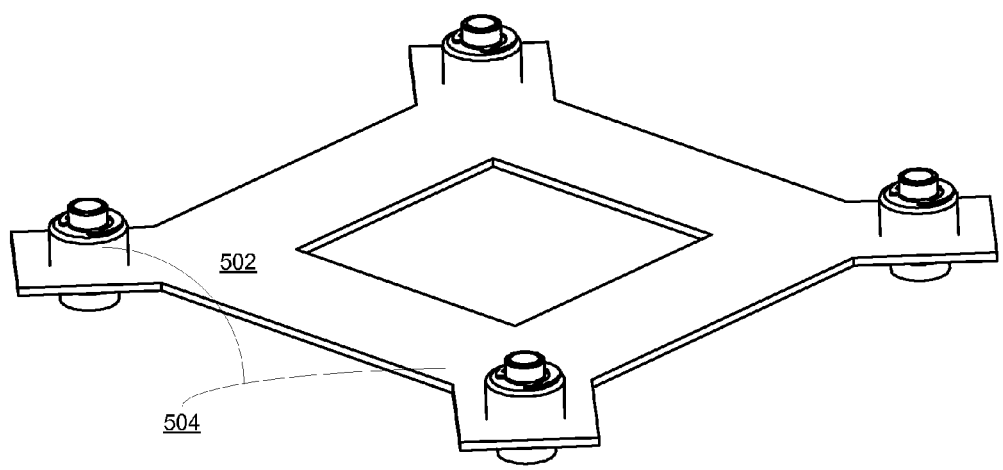
FIG. 5 is an illustration of a back plate according to some embodiments.

FIG. 5 is an illustration of a back plate including pre-loaded spring assemblies according to some embodiments. In some embodiments, a load may be applied using a top plate on the top of an LGA package substrate, which is reacted by a bottom plate 502. The bottom plate may include pre-loaded spring assemblies 504 at each of four corners of the bottom plate 502.

Figure 6:
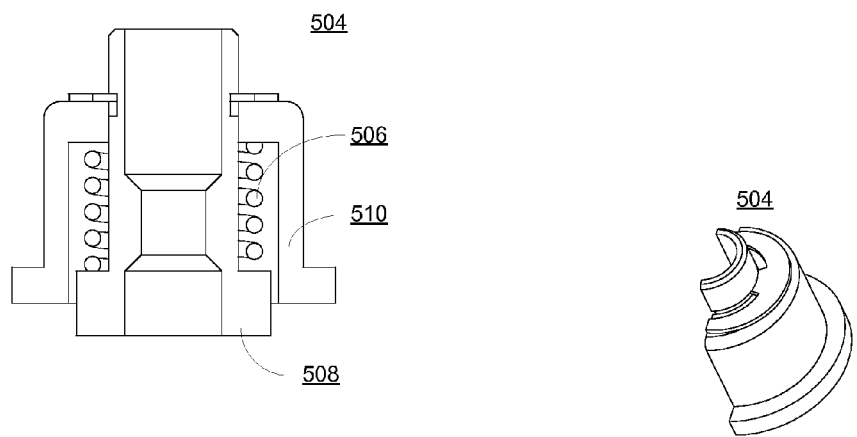
FIG. 6 is an illustration of a pre-loaded spring assembly according to some embodiments.

FIG. 6 is an illustration of a cross-section of the pre-loaded spring assembly 504 of FIG. 5 according to some embodiments. The pre-loaded spring assembly 504 includes an inner portion 508 and an outer portion 510. The inner portion 508 and the outer portion 510 may move with respect to each other when a spring 506 inside the spring assembly 504 is compressed or decompressed. Each spring assembly may be pre-loaded to provide a compressive load of approximately 5-10 lbf. When a total of four pre-loaded spring assemblies are used, the total compressive load applied to an LGA package substrate by the spring assemblies may be approximately 20-40 lbf.

Figure 7:
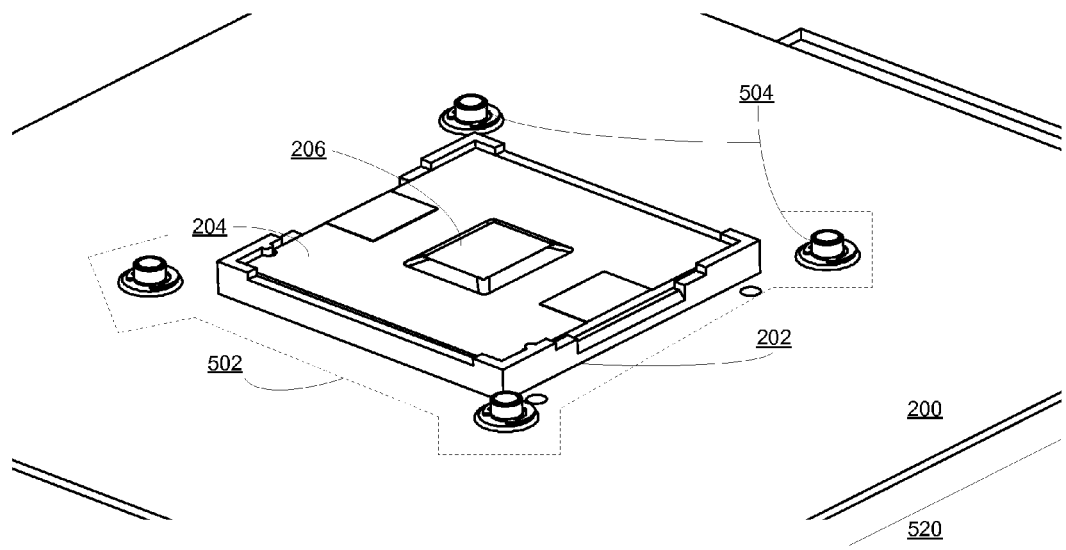
FIG. 7 is an illustration of a printed circuit board and socket assembly placed over a back plate according to some embodiments.

FIG. 7 is an illustration of a printed circuit board and LGA socket assembly placed over the back plate 502 of FIG. 5 according to some embodiments. Back plate 502 is on a bottom side of a printed circuit board 200, directly beneath an LGA socket 202. An LGA package including an LGA package substrate 204 and semiconductor die 206 may be placed in socket 202. The pre-loaded spring assemblies 504 may be placed between the back plate 502 and a computer chassis 520 located below and parallel to the printed circuit board. The pre-loaded spring assemblies may connect the chassis 520, back plate 502, and the printed circuit board 200.

Figure 8:
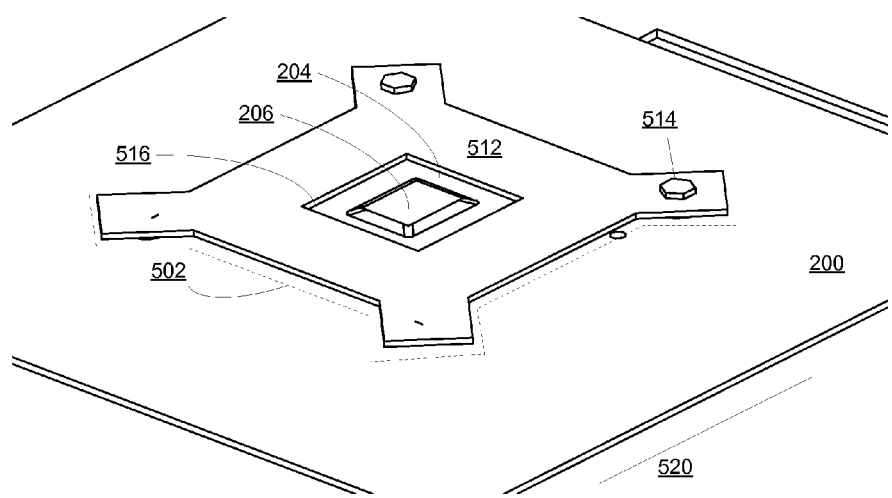
FIG. 8 is an illustration of top side loading using a top plate according to some embodiments.

A compressive load may be applied to the top side of the LGA package 204 by placing a top plate over the LGA package, pre-loaded springs, and bottom plate of FIG. 7, as illustrated in FIG. 8. The top plate 512 may be a rigid plate or a flexible plate. In some embodiments, the top plate 512 may be coupled to the bottom plate 502 and/or the pre-loaded springs (FIG. 7, 504) with fasteners 514, which may be screws or other fastening mechanisms. Top plate 512 may include a void or opening 516 so that the top plate is not covering any portion of the die 206. The top plate may contact only the top surface of the package substrate 204, applying a compressive load directly to the package substrate 204. A heat pipe may be attached to the top of die 206, and may apply a compressive load directly to the die. In some embodiments, top plate 512 may be replaced by a heat pipe having compressive leaf springs, such as that of FIGS. 1A-D, in order to apply a separate compressive load to the package substrate and to the die.

Figure 9A:
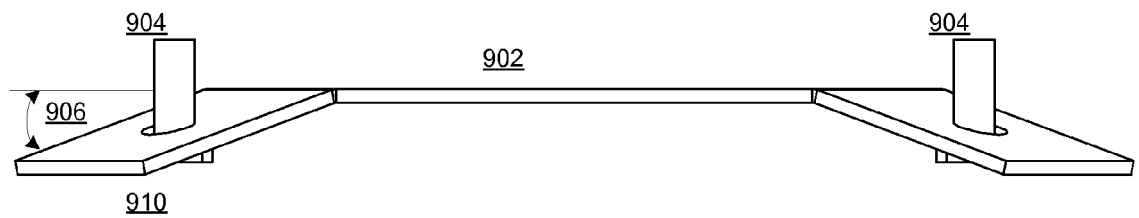
FIGS. 9A-9B are illustrations of a back plate for loading according to some embodiments.
Figure 9B:
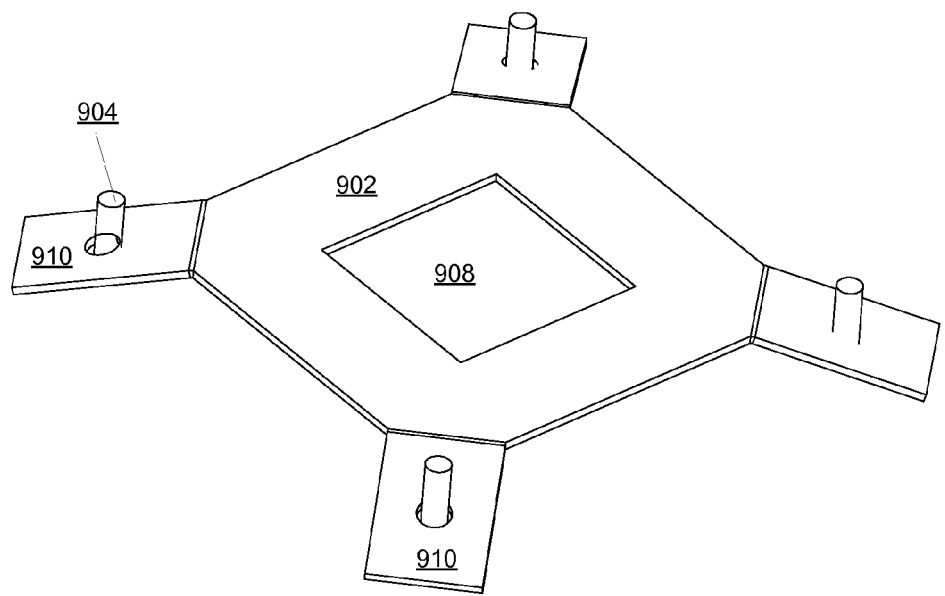

FIGS. 9A-9B are illustrations of a back plate for loading according to some embodiments. FIG. 9A illustrates a side view of a back plate 902 according to some embodiments. The back plate 902 may have a tab 910 at each corner of the plate, each tab having an angle of bend 906. The angle of bend 906 of the tab 910 may be determined by the amount of load required for the back plate 902. A greater angle of bend will provide a greater load, while a lesser angle of bend will provide a lesser load. Depending on the desired load, the angle of bend may be between approximately 5 and 30 degrees in some embodiments. Each tab 910 may also include a fastener 904, which in some embodiments may be a captive screw.

FIG. 9B illustrates a three-dimensional view of the back plate 902 of FIG. 9A. The back plate 902 has tabs 910 at each corner, each tab 910 bent at an angle with respect to the plate and including a fastener 904. The back plate may also include a central opening or void 908 in some embodiments. This opening 908 may be provided to allow room on the back side of the motherboard to mount capacitors and/or other passive components beneath the LGA socket.

Figure 10A:
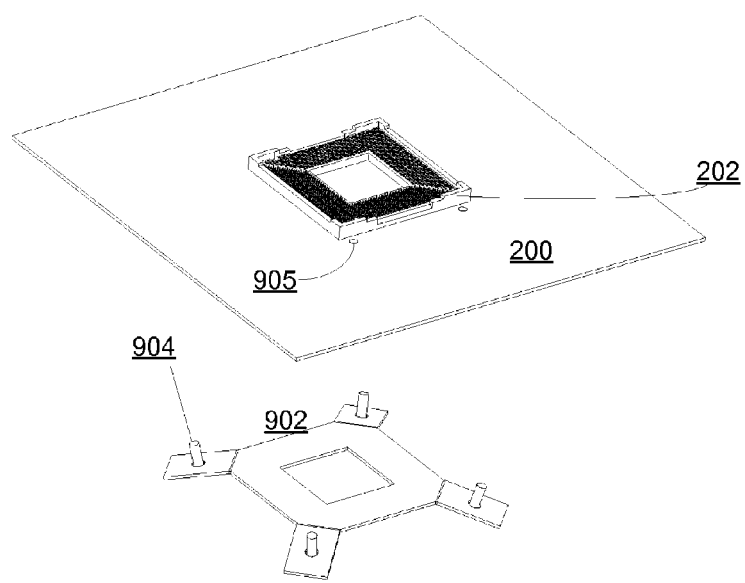
FIGS. 10A-10B are illustrations of printed circuit board and socket assembly using a back plate for loading according to some embodiments.
Figure 10B:
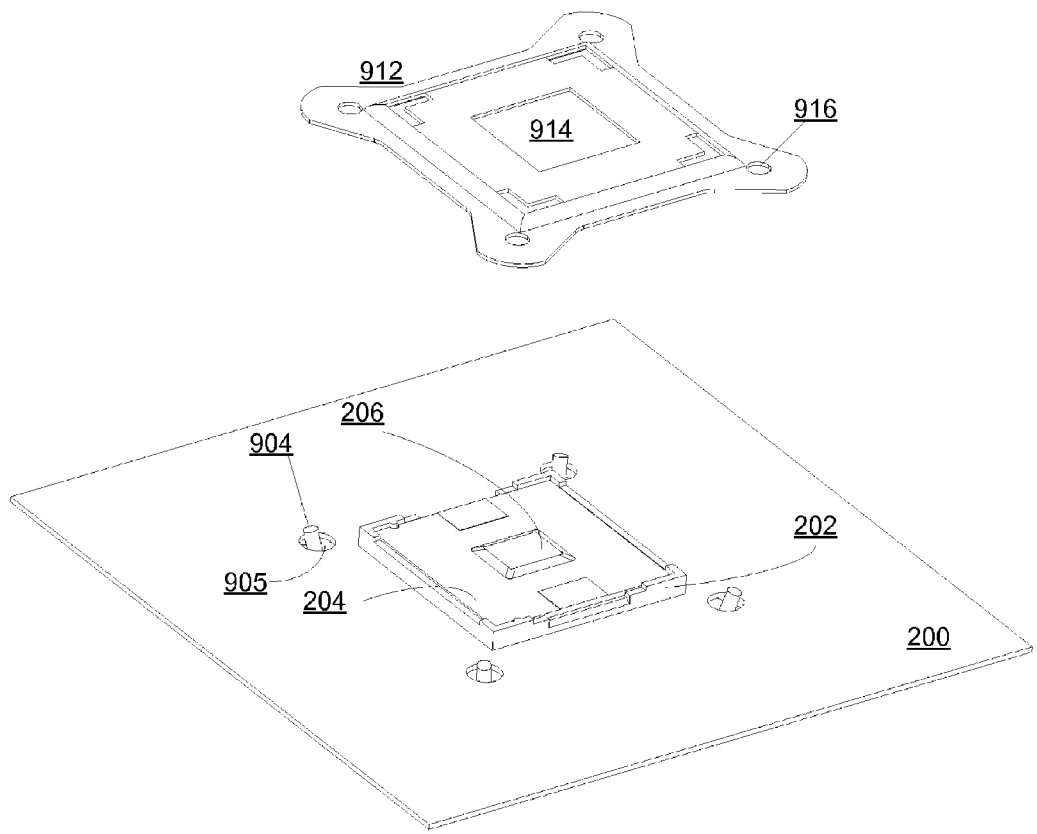

FIGS. 10A-10B are illustrations of printed circuit board and socket assembly using the back plate of FIGS. 9A-9B for loading according to some embodiments. FIG. 10A shows the back plate 902 aligned under an LGA socket 202 on a printed circuit board 200. Screws or fasteners 904 may be aligned to holes 905 in the printed circuit board. After the back plate 902 and fasteners 904 are aligned under the printed circuit board 200, a top plate 912 may be placed over the LGA socket 202 and the LGA package substrate 204, as shown in FIG. 10B. The top plate 912 may include an opening 914 for the die 206 so that the top plate 912 does not cover any portion of the die 206. Holes 916 in the top plate 912 may be aligned with fasteners or screws 904.

Figure 11A:
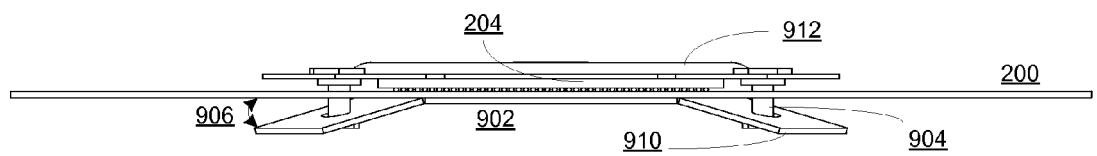
FIGS. 11A and 11B are illustrations of a side view of a socket assembly using a back plate and a top plate for loading, pre-loading and post-loading, according to some embodiments.
Figure 11B:
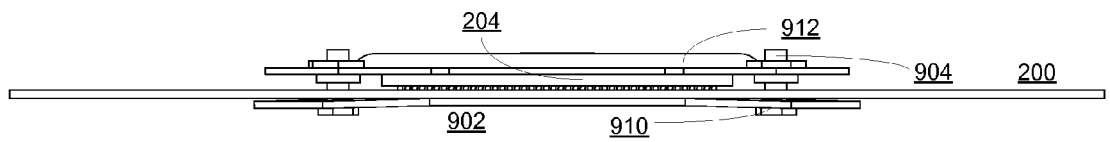

FIGS. 11A and 11B are illustrations of a cutaway side view of a socket assembly using the back plate and top plate of FIGS. 9A-B and 10A-B, pre-loading and post-loading. As illustrated in FIG. 11A, before the screws or fasteners 904 are tightened and a load is applied to the package substrate, the back plate 902 has an angle of bend 906 at each tab 910. When the screws or fasteners 904 are tightened, the angled tabs 910 are flattened, thus applying a compressive load to the package substrate 204. The top plate 912 may be more rigid than the back plate 902, and thus may not deform when a load is applied.

In some embodiments, a separate compressive load may be applied to the top surface of the die that is exposed through the opening in the top plate 912. The compressive load may be applied, for example, by a heat pipe coupled to the die.

Figure 12:
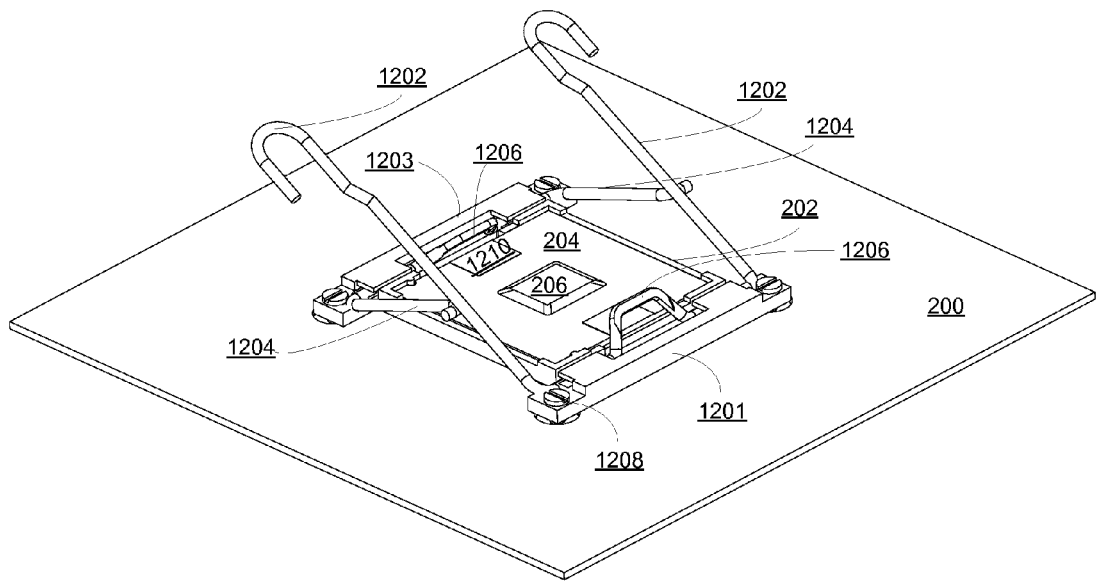
FIG. 12 is an illustration of a lever actuated loading mechanism to apply a compressive load to a package according to some embodiments.

FIG. 12 is an illustration of a lever actuated loading and retention mechanism to apply a compressive load to a package according to some embodiments. The mechanism may include two retention lever modules, 1201 and 1203. The retention lever modules 1201, 1203 may be assembled on a printed circuit board 200, one on each side of an LGA socket 202. The loading and retention mechanism may be fastened to the printed circuit board with fasteners 1208, which in some embodiments may be screws.

Module 1201 may include a lever 1202 having a center portion 1206 which extends out from the lever axis top make contact with the top surface of an LGA package substrate when the lever 1202 is fully actuated. Module 1203 may include a shorter lever 1204 having a center portion 1206 which extends out from the lever axis to make contact with the top surface of an LGA package substrate 204 when the levers are fully actuated. The top surface of the LGA package 204 may include landing pads 1210 on which the center portions 1206 of the levers 1202, 1204 will rest, thus applying a compressive load to the substrate 204.

Figure 13:
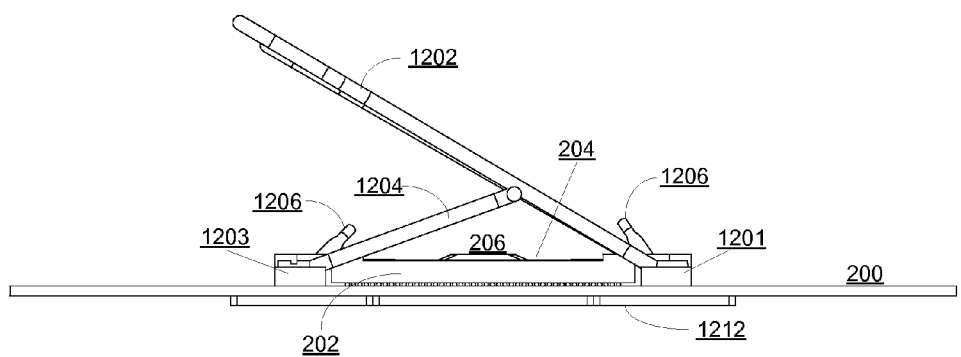
FIG. 13 is an illustration of a side view of a lever actuated loading mechanism to apply a compressive load to a package according to some embodiments.

FIG. 13 is an illustration of a side view of the lever actuated loading mechanism of FIG. 12, according to some embodiments. A back plate 1212 may be attached to the printed circuit board 200 directly below the LGA socket 202 and loading/retention modules 1201, 1203. The back plate may provide a reactive force for the load applied by the center portions 1206 of the levers. Lever 1202 may drive a smaller lever 1204, thus applying a compressive load to the top surface of an LGA package 204 with center lever portions 1206.

Figure 14:
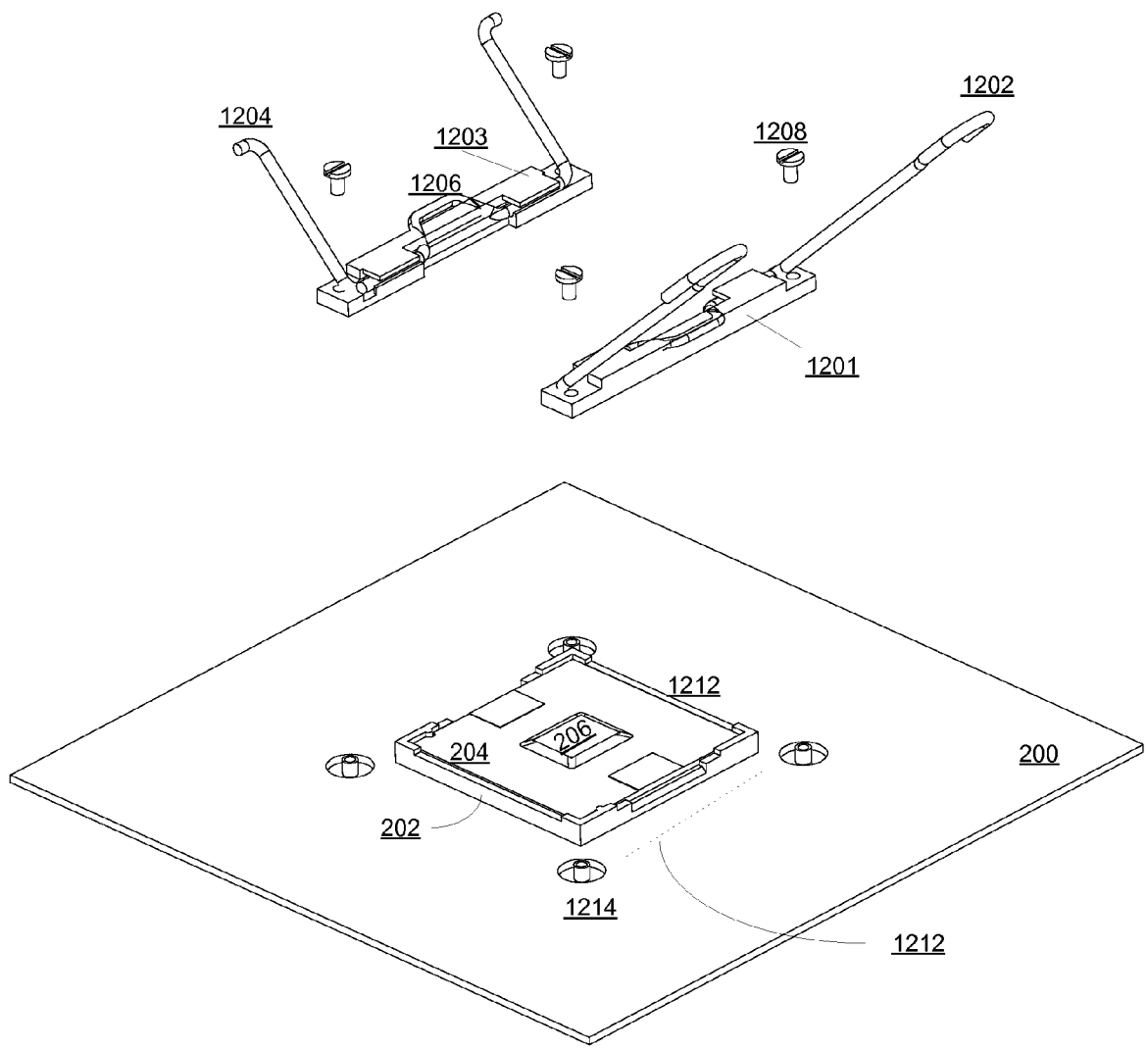
FIG. 14 is an illustration of an exploded view of a lever actuated loading mechanism according to some embodiments.

FIG. 14 is an illustration of an exploded view of the lever actuated loading mechanism of FIGS. 12-13 according to some embodiments. As described above with respect to FIGS. 12 and 13, the loading mechanism may include two modules, a module 1203 having a shorter lever 1204, a module 1201 having a longer lever, 1202. The modules 1201, 1203 may be fastened to a printed circuit board 200 on either side of an LGA socket 202. Screws or other fasteners 1208 may be used to fasten the retention mechanism to the printed circuit board. The fasteners or screws 1208 may be seated in fastener receptacles 1214 that are integrated into a back plate 1212 placed on the bottom of the printed circuit board 200 directly below the socket 202.

Figure 15:
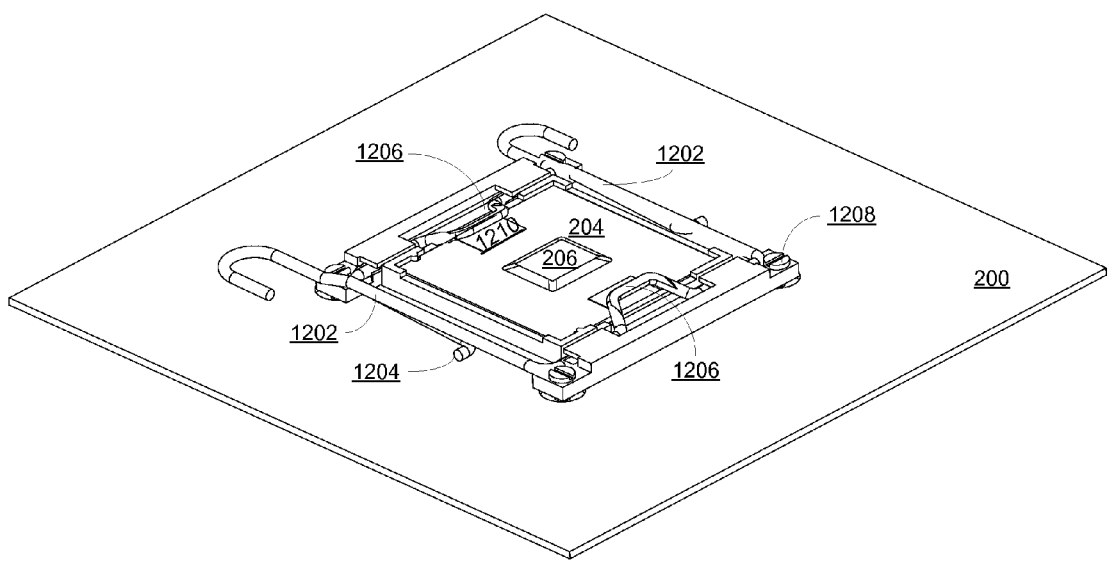
FIG. 15 is an illustration of a compressive load applied to a package using a lever actuated loading mechanism according to some embodiments.

FIG. 15 is an illustration of a compressive load applied to a package using the lever actuated loading mechanism of FIGS. 12-14 according to some embodiments. When lever 1202 is closed, it drives lever 1204 closed as well. The center portions 1206 of levers 1202 and 1204 make contact with regions 1210 on the top surface of an LGA package substrate 204, and apply a compressive load to the substrate. The compressive load applied to the package substrate 204 by portions 106 of the levers may be reacted by a back plate coupled to the loading mechanism on the bottom side of the printed circuit board 200. In some embodiments, a second compressive load may be applied to a top surface of die 206, for example, by a heat pipe.

Figure 16:
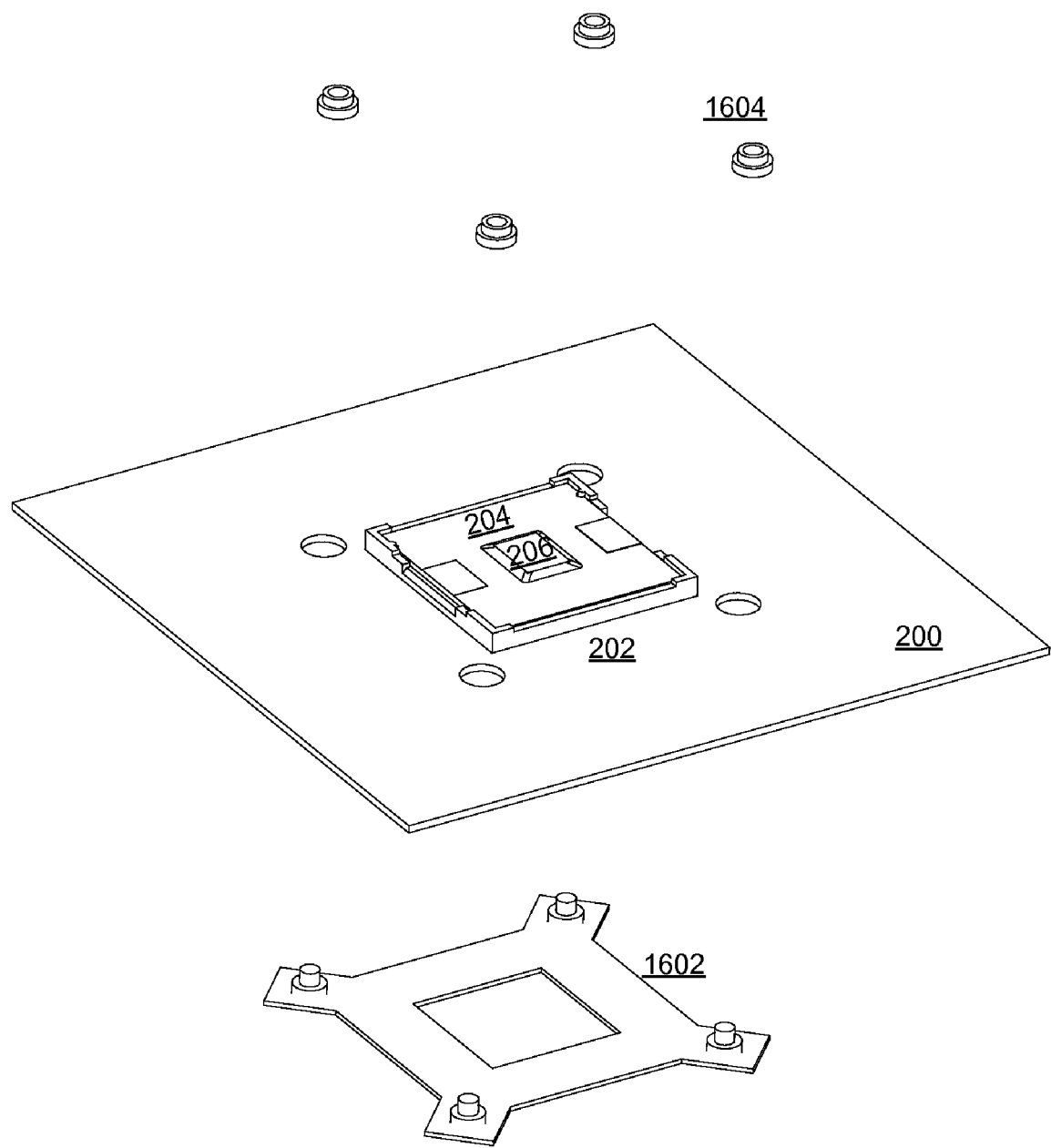
FIG. 16 is an illustration of a back plate being attached to a printed circuit board according to some embodiments.

FIG. 16 is an illustration of a back plate being attached to a printed circuit board according to some embodiments. The back plate 1602 may be attached to a printed circuit board 200 beneath an LGA socket 202 using top mounting screws 1604 or another fastening mechanism. The back plate 1602 may be provided to react a load applied by a deformable top plate, as illustrated in FIG. 17.

Figure 17:
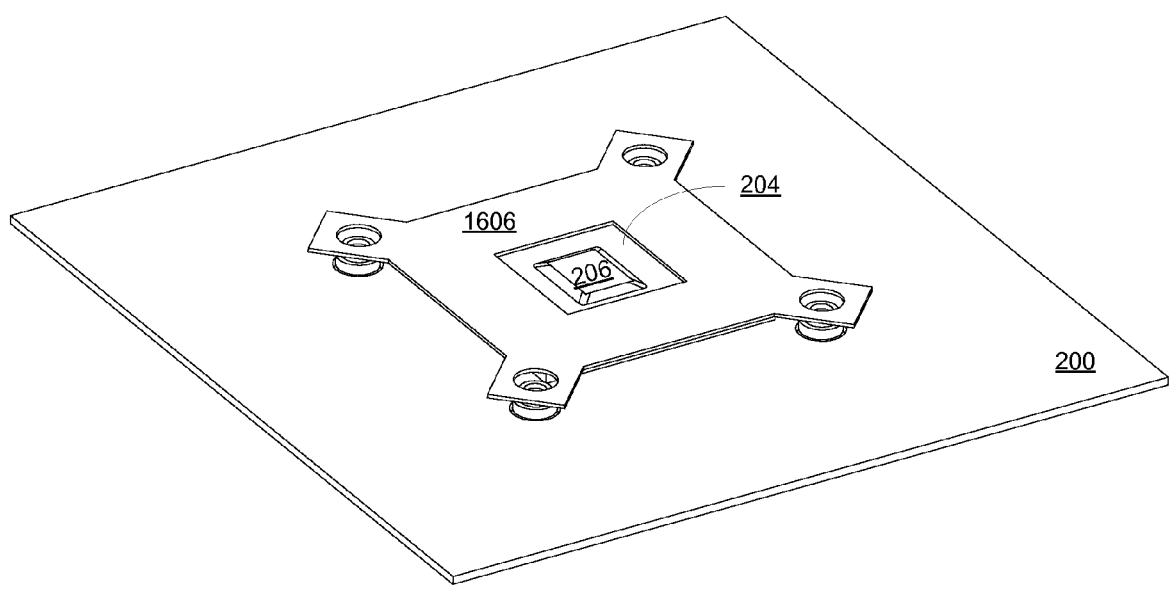
FIG. 17 is an illustration of a deformable top plate placed over a package, socket, printed circuit board, and back plate according to some embodiments.

FIG. 17 is an illustration of a deformable top plate 1606 according to some embodiments. The deformable top plate 1606 may be placed over the back plate 1602, printed circuit board 200, and LGA socket 202 of FIG. 16. When secured in place, the deformable top plate 1606 may apply a load to the LGA package substrate 204. The deformable top plate 1606 may include an opening for die 206, such that any load applied by the top plate 1606 is applied only to the package substrate 204 and not to the die 206.

Figure 18:
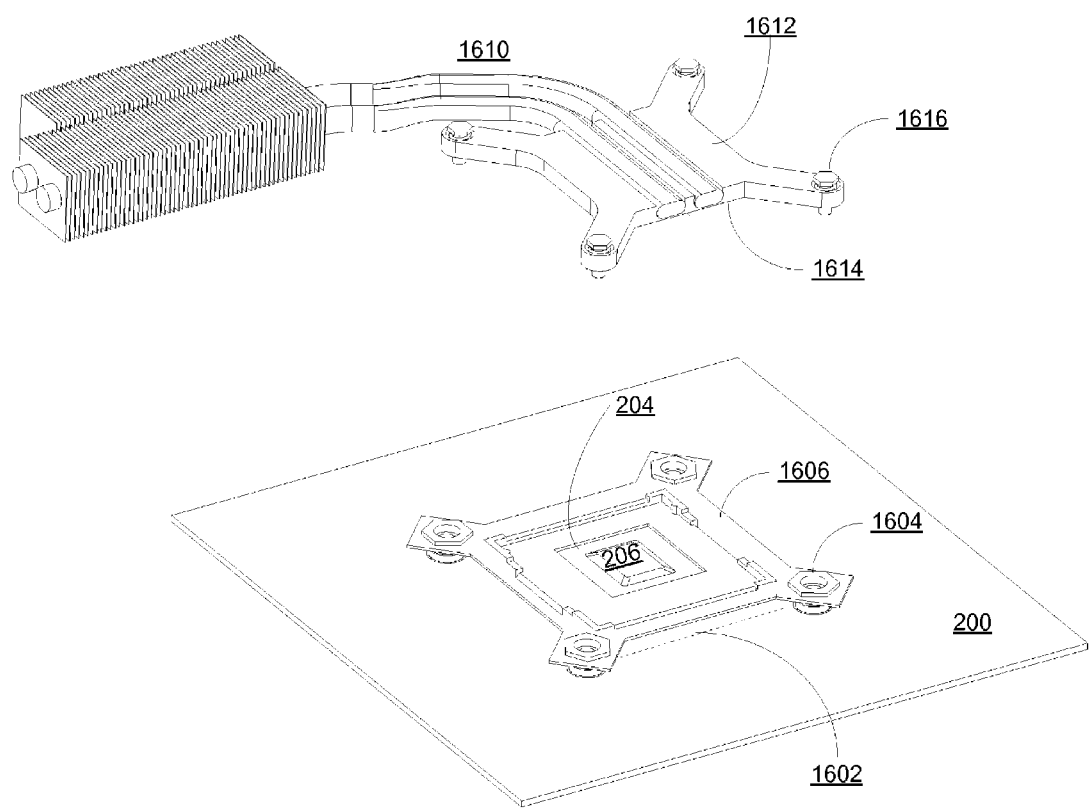
FIG. 18 is an illustration of a heat pipe for an LGA package according to some embodiments.

FIG. 18 is an illustration of a heat pipe for an LGA package according to some embodiments. The heat pipe 1610 or other thermal solution may be placed over the top plate 1606 of FIG. 17, and may be attached to the top plate using the same fasteners 1604 used to attach the top plate 1606 to the bottom plate 1602. In some embodiments, fasteners 1604 may be screws or bolts having a central threaded void to receive the screw or bolt fasteners 1616 of the heat pipe 1610. The heat pipe 1610 may include a conductive plate 1612 having a bottom surface 1614. When fasteners 1616 are coupled to fasteners 1604 and tightened, the bottom surface 1614 of the conductive plate 1612 may make contact with and apply a compressive load to a top surface of a die 206 on an LGA package.

Figure 19:
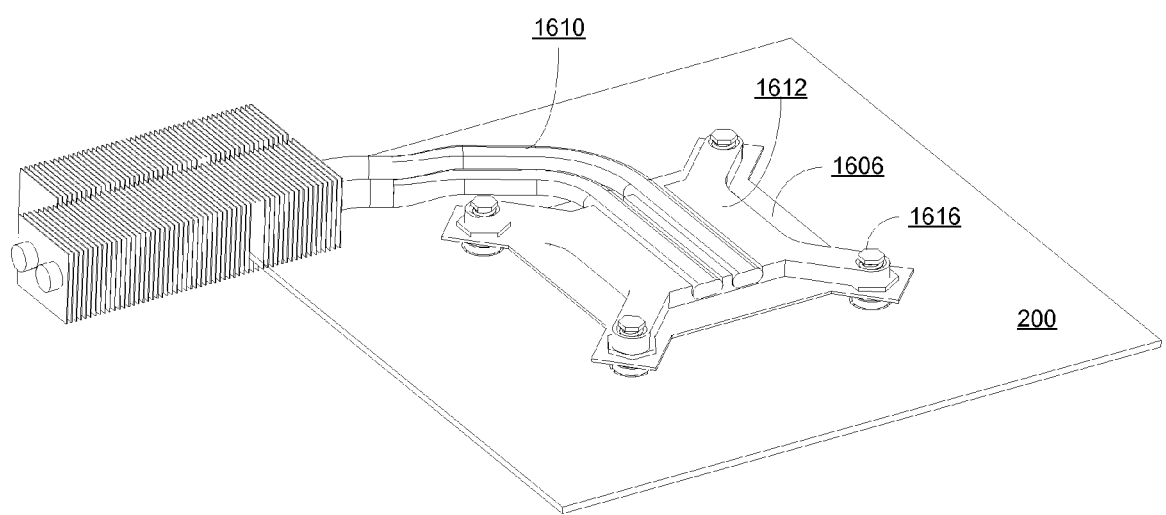
FIG. 19 is an illustration of a heat pipe applying a compressive load to a die according to some embodiments.

Thus, a compressive load may be applied directly to the LGA package substrate 204 by top plate 1606, while a separate compressive load is applied directly to the top surface of the die 206 by the heat pipe 1610. FIG. 19 illustrates a conductive plate 1612 of a heat pipe 1610 applying a compressive load to a die mounted to an LGA package while a deformable top plate 1606 applies a separate compressive load to the LGA package substrate according to some embodiments, as described above with respect to FIGS. 16-18.

Figure 20:
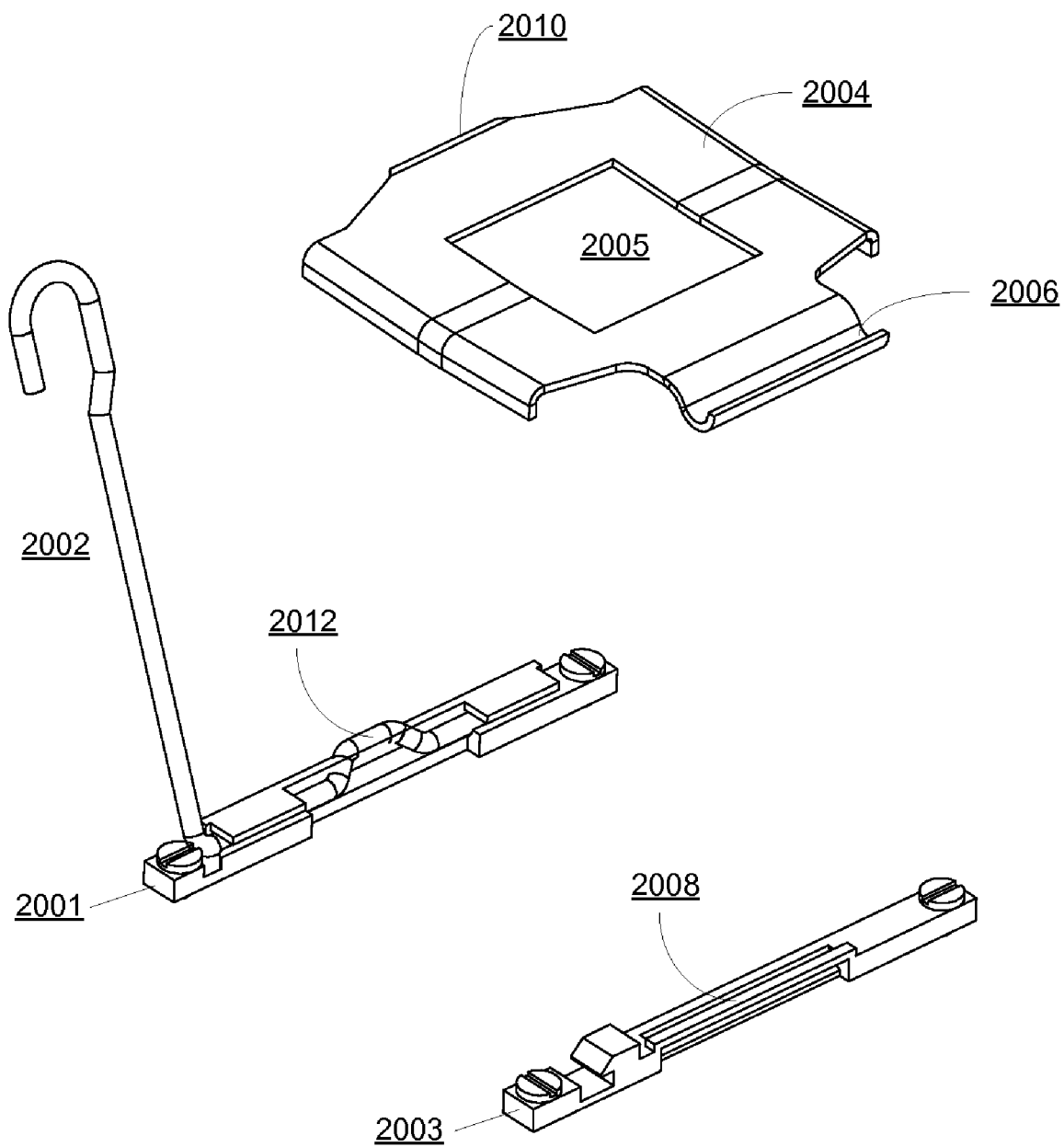
FIG. 20 is an illustration of an LGA retention mechanism according to some embodiments.

FIG. 20 is an illustration of an LGA package retention and loading mechanism according to some embodiments. The retention mechanism includes three parts. The first half 2001 of the retention mechanism includes a lever 2002 and latch portion 2012 of the lever. The second half 2003 of the retention mechanism includes an opening or slot 2008 to hold a top plate 2004 in place. The top plate 2004 has a central opening 2005 or void for a die, a first lip 2006 to attach the top plate 2004 to the opening 2008 in one half of the retention mechanism, and a second lip 2010 to be clasped under the latch portion 2012 of the lever 2002. In some embodiments, the three separate parts of the loading mechanism of FIG. 20 may be integrated into a single unit or two separate units.

Figure 21:
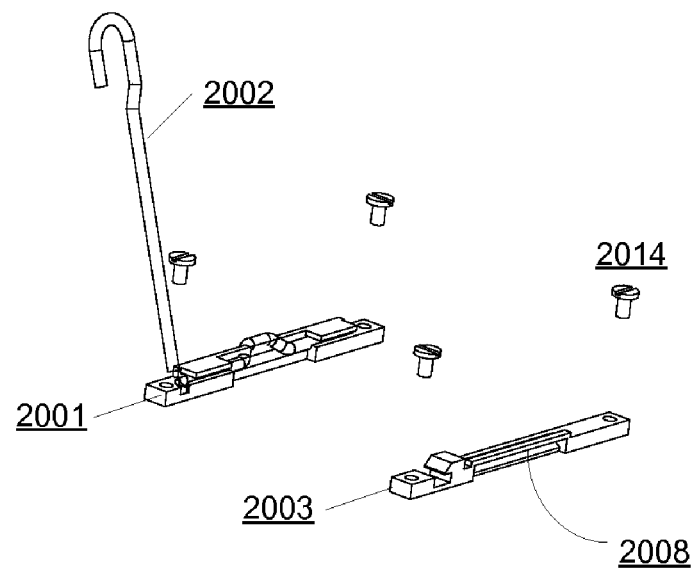
FIG. 21 is an exploded view of an LGA retention mechanism assembly according to some embodiments.
Figure 21:
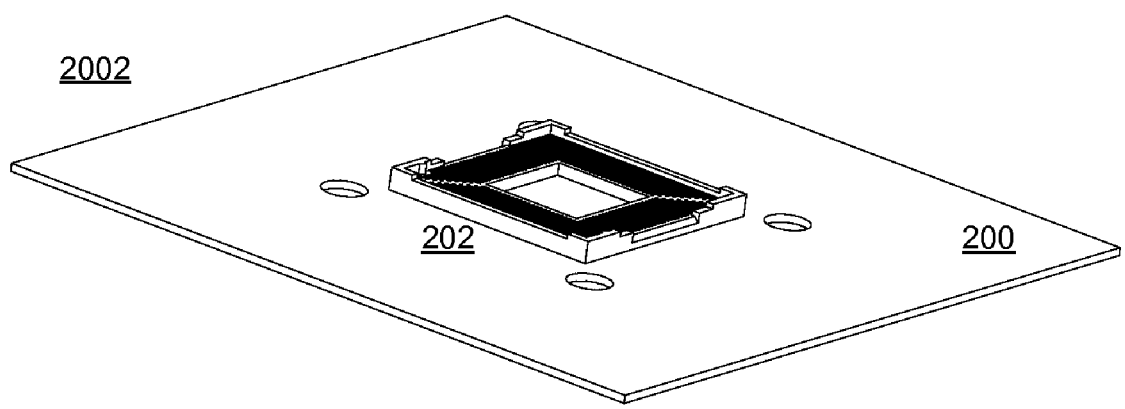
Figure 21:
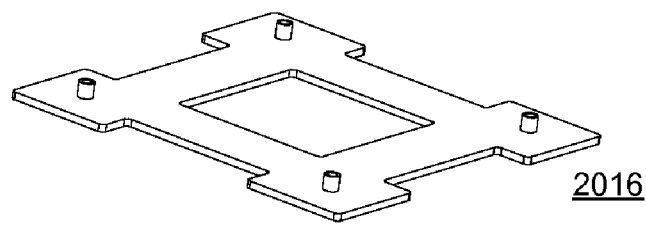

FIG. 21 is an exploded view of the LGA retention mechanism assembly of FIG. 20 being attached to a printed circuit board 200 according to some embodiments. A back plate 2016 may be mounted to a bottom side of a printed circuit board 200, directly beneath an LGA socket 202. The first half 2001 second half 2003 of the retention mechanism assembly may be aligned on either side of the LGA socket 202. The retention mechanism 2001, 2003, printed circuit board 200 and back plate 2016 may be attached to one another using four top mounting screws 2014 or other fasteners.

Figure 22:
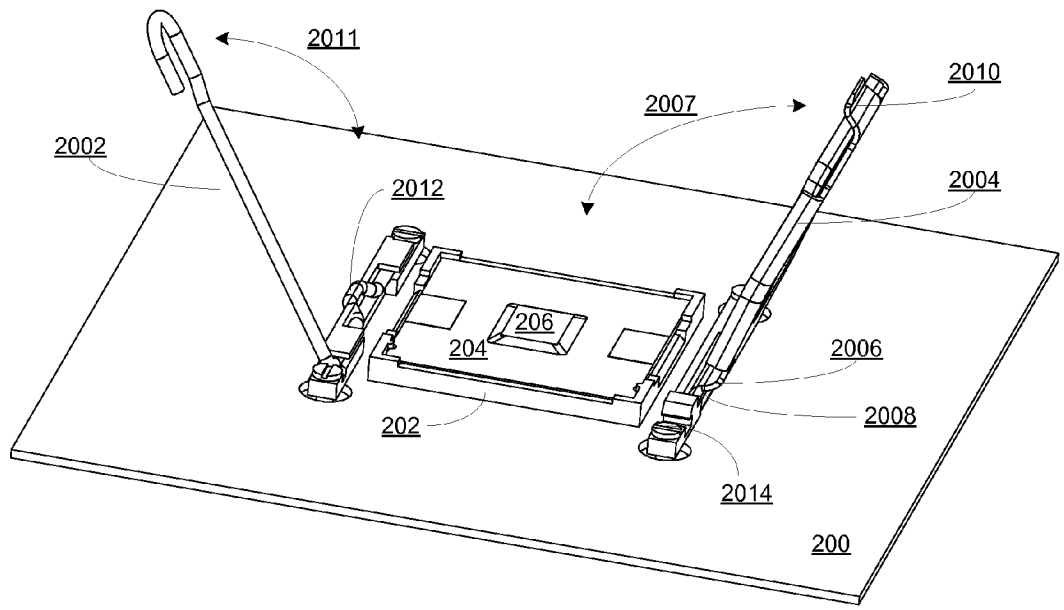
FIG. 22 is an illustration of an LGA retention mechanism according to some embodiments.

FIG. 22 is an illustration of the LGA retention mechanism of FIGS. 20 and 21 according to some embodiments. The first lip 2006 may be inserted into the slot 2008 in the retention mechanism. The lip and slot combination may act as a hinge, allowing the top plate 2004 to open and close 2007 along an axis. When an LGA package is seated in an LGA socket 202, the top plate 2004 may close over the package substrate 204 to apply a compressive load to the package substrate 204. The lip 2010 of the load plate 2004 may be latched into place by the latch portion 2012 of the lever 2002 when the lever is rotated 2011 and tightly closed.

Figure 23:
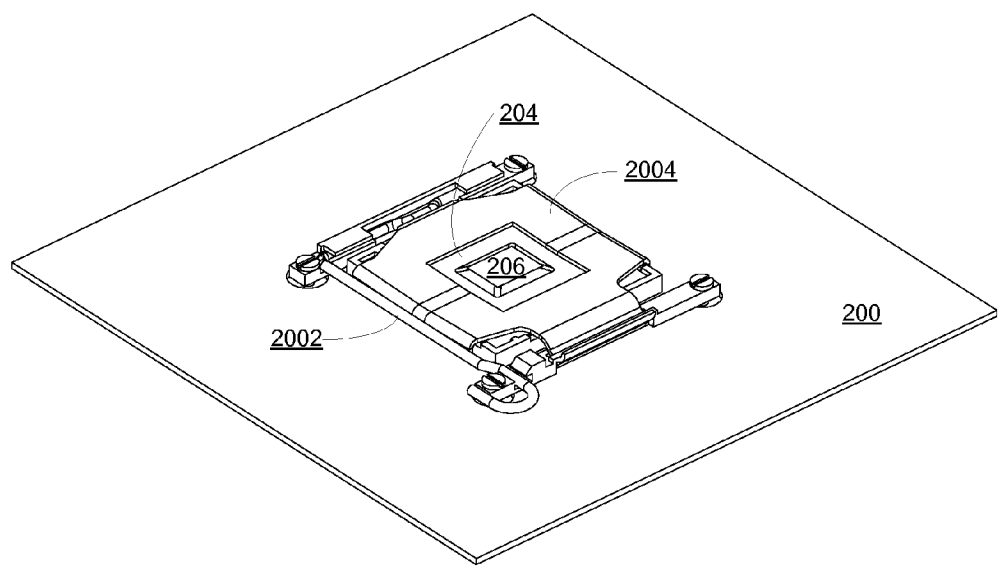
FIG. 23 is an illustration of an LGA retention mechanism according to some embodiments.

FIG. 23 is an illustration of the LGA retention mechanism of FIG. 22 after lever 2002 has been latched closed. When the lever 2002 is securely latched down, the top plate 2004 will deform, thus applying a load directly to the LGA package substrate 204. The top plate 2004 does not apply a load to the die 206. In some embodiments, a separate load may be applied to the die 206, for example, by attaching a heat pipe to the top surface of the die.

In some embodiments, each of the loading mechanisms described above with respect to FIGS. 1-23 is a low profile mechanism, having a total maximum height of approximately 4 mm. The loading mechanisms disclosed herein may be utilized, for example, in mobile computing systems having a thickness of one inch or less.

Thus, land grid array package and die loading mechanisms are disclosed in various embodiments. In the above description, numerous specific details are set forth. However, it is understood that embodiments may be practiced without these specific details. In other instances, well-known circuits, structures, and techniques have not been shown in detail in order not to obscure the understanding of this description. Embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

We claim:

1. A method comprising:
   applying a first compressive load directly to a top surface of a die mounted on a land grid array (LGA) package substrate through a conductive plate attached to one end of a heat pipe wherein the conductive plate directly contacts the top surface of the die; and
   applying a second compressive load directly to a top surface of the LGA package substrate with at least two leaf springs on a bottom surface of the conductive plate of the heat pipe in direct contact with the top surface of the LGA package substrate such that the second compressive load has a greater magnitude than the first compressive load based on two distinct applied forces.

2. The method of claim 1, wherein applying the first compressive load to the top surface of the die mounted on the LGA package substrate comprises attaching the conductive plate of the heat pipe the top surface of the die using screws.

3. The method of claim 1, wherein the first compressive load has a magnitude of between 10 and 30 lbf.

4. The method of claim 3, wherein the second compressive load has a magnitude of between 60 and 90 lbf.

5. The method of claim 1, wherein applying the first compressive load to the top surface of the die mounted on the LGA package substrate comprises attaching the conductive plate of the heat pipe to the top surface of the die using a lever actuated loading mechanism.

6. The method of claim 5, wherein the lever actuated loading mechanism includes a lever to rotate on an axis, the lever having a loading portion to contact a top surface of the conductive plate.

7. An apparatus comprising:
   a land grid array (LGA) socket mounted to a printed circuit board;
   an LGA package seated in the LGA socket, the LGA package including an LGA package substrate and a semiconductor die mounted on the LGA package substrate; and
   a heat pipe attached to the semiconductor die, wherein the heat pipe includes a conductive plate that applies a first compressive load directly to the semiconductor die, and wherein the conductive plate of the heat pipe includes at least two leaf springs which apply a second compressive load directly to the LGA package substrate, wherein the second compressive load applied to the LGA package substrate has a greater magnitude than the first compressive load applied to the semiconductor die based on a compression of the leaf springs.

8. The apparatus of claim 7, wherein the compressive force applied to the semiconductor die by the conductive plate has a magnitude of between 10 and 30 lbf and the compressive force applied by the leaf springs to the LGA package substrate has a magnitude of between 60 and 90 lbf.

9. The apparatus of claim 7, further comprising a back plate mounted to a back side of the printed circuit board below the LGA socket.

10. The apparatus of claim 9, wherein a lever actuated loading mechanism is coupled to the printed circuit board and to the heat pipe, and is to apply a load to the heat pipe.

11. The apparatus of claim 9, wherein the heat pipe, the printed circuit board, and the back plate are coupled together using a plurality of fasteners.

12. The apparatus of claim 11, wherein the plurality of fasteners are a plurality of screws.

13. An apparatus comprising:
   a land grid array (LGA) socket mounted to a printed circuit board;
   an LGA package seated in the LGA socket, the LGA package including an LGA package substrate and a semiconductor die mounted on the LGA package substrate; and
   a heat pipe mounted above the LGA socket, the heat pipe includes a conductive plate at one end of the heat pipe and at least two leaf springs on a bottom surface of the conductive plate, the conductive plate applies a compressive load directly to the semiconductor die and the at least two leaf springs apply a compressive force directly to a top surface of the LGA package substrate, wherein the compressive force applied to the LGA package substrate has a greater magnitude than the compressive load applied to the semiconductor die based on a compression of the leaf springs.

14. The apparatus of claim 13, wherein the compressive force applied to the semiconductor die by the conductive plate has a magnitude of between 10 and 30 lbf and the compressive force applied by the leaf springs to the LGA package substrate has a magnitude of between 60 and 90 lbf.

15. The apparatus of claim 13, wherein applying the compressive load to the top surface of the die mounted on the LGA package substrate comprises attaching the conductive plate of the heat pipe the top surface of the die using screws.

16. The apparatus of claim 13, wherein applying the compressive load to the top surface of the die mounted on the LGA package substrate comprises attaching the conductive plate of the heat pipe to the top surface of the die using a lever actuated loading mechanism.

17. The apparatus of claim 16, wherein the lever actuated loading mechanism includes a lever to rotate on an axis, the lever having a loading portion to contact a top surface of the conductive plate.

18. An apparatus comprising:
   a heat pipe including a conductive plate, wherein the conductive plate includes at least two springs attached to a bottom surface of the conductive plate, each of the at least two springs make contact with and apply a compressive load directly to a top surface of a land grid array (LGA) package substrate, and wherein a portion of the bottom surface of the conductive plate makes direct contact with and applies a compressive load to a top surface of a die mounted on the LGA package substrate, wherein the compressive load applied to the LGA package substrate has a greater magnitude than the compressive load applied to the die based on a compression of the leaf springs.

19. The apparatus of claim 18, wherein the at least two springs are leaf springs.

20. The apparatus of claim 18, wherein the compressive force applied to the semiconductor die by the conductive plate has a magnitude of between 10 and 30 lbf and the compressive force applied by the springs to the LGA package substrate has a magnitude of between 60 and 90 lbf.

21. The apparatus of claim 18, wherein applying the compressive load to the top surface of the die mounted on the LGA package substrate comprises attaching the conductive plate of the heat pipe the top surface of the die using screws.

22. The apparatus of claim 18, wherein applying the compressive load to the top surface of the die mounted on the LGA package substrate comprises attaching the conductive plate of the heat pipe to the top surface of the die using a lever actuated loading mechanism.

23. The apparatus of claim 18, wherein the lever actuated loading mechanism includes a lever to rotate on an axis, the lever having a loading portion to contact a top surface of the conductive plate.

* * * * *